United States Patent
BrightSky et al.

(10) Patent No.: US 12,342,736 B2
(45) Date of Patent: Jun. 24, 2025

(54) PHASE-CHANGE MEMORY CELL WITH MIXED-MATERIAL SWITCHABLE REGION

(71) Applicant: International Business Machines Corporation, Armonk, NY (US)

(72) Inventors: Matthew Joseph BrightSky, Armonk, NY (US); Cheng-Wei Cheng, White Plains, NY (US); Guy M. Cohen, Westchester, NY (US); Robert L. Bruce, White Plains, NY (US); Asit Ray, Baldwin, NY (US); Wanki Kim, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 18/063,189

(22) Filed: Dec. 8, 2022

(65) Prior Publication Data
US 2024/0196766 A1   Jun. 13, 2024

(51) Int. Cl.
*H10N 70/00* (2023.01)
*H10N 70/20* (2023.01)

(52) U.S. Cl.
CPC ......... *H10N 70/828* (2023.02); *H10N 70/231* (2023.02); *H10N 70/8828* (2023.02)

(58) Field of Classification Search
CPC ................................................ H10N 70/8828
See application file for complete search history.

(56) References Cited

U.S. PATENT DOCUMENTS

| | | |
|---|---|---|
| 6,927,410 B2 | 8/2005 | Chen |
| 7,888,155 B2 | 2/2011 | Chen |
| 8,049,202 B2 | 11/2011 | Khang et al. |
| 9,543,515 B2 | 1/2017 | Gealy et al. |
| 10,026,895 B2 | 7/2018 | Kamata |
| 10,217,513 B2 | 2/2019 | Lee |

(Continued)

FOREIGN PATENT DOCUMENTS

CN        107768517 A        3/2018

OTHER PUBLICATIONS

International Search Report and Written Opinion dated Feb. 18, 2024, for International Application No. PCT/CN2023/132548, filed Nov. 20, 2023.

(Continued)

*Primary Examiner* — Mounir S Amer
(74) *Attorney, Agent, or Firm* — Scott Dobson

(57) ABSTRACT

An electronic device includes a first electrode, a second electrode, and a memory component configured to store a resistive state. The memory component includes a layered region arranged in direct contact with the first electrode and a bulk region arranged in direct contact with the second electrode. The layered region includes a plurality of first layers made of a first material and a plurality of second layers made of a second material alternatingly arranged with one another. The first material is a phase-change material and the second material is a non-phase-change material. The bulk region is a continuous mass made of a third material that is different than the first material and the second material, and the bulk region is in direct contact with at least two of the first layers and at least one of the second layers of the layered region.

20 Claims, 5 Drawing Sheets

(56) References Cited

U.S. PATENT DOCUMENTS

| | | | |
|---|---|---|---|
| 2010/0163826 A1* | 7/2010 | Peters | H10N 70/823 |
| | | | 257/E47.001 |
| 2018/0114900 A1 | 4/2018 | Kamata | |
| 2020/0091242 A1 | 3/2020 | Cheng | |
| 2021/0202839 A1 | 7/2021 | Tominaga et al. | |
| 2021/0257547 A1 | 8/2021 | Shen | |
| 2022/0102627 A1 | 3/2022 | Ok et al. | |
| 2022/0115590 A1 | 4/2022 | Khan et al. | |
| 2023/0200267 A1* | 6/2023 | Brew | H10N 70/823 |
| | | | 365/163 |

OTHER PUBLICATIONS

Ding et al., "Phase-change heterostructure enables ultralow noise and drift for memory operation," Science, vol. 366, No. 6462, 2019, pp. 210-215.

Khan et al., "Electro-Thermal Confinement Enables Improved Superlattice Phase Change Memory," IEEE Electron Device Letters, vol. 43, No. 2, 2022, pp. 204-207.

* cited by examiner

PHASE-CHANGE MEMORY CELL WITH MIXED-MATERIAL SWITCHABLE REGION

BACKGROUND

The present disclosure relates to the electrical, electronic, and computer fields. In particular, the present disclosure relates to phase-change memory (PCM) devices having a phase-change material in a layered structure.

PCM is a type of non-volatile random-access memory used in computers and other electronic devices to store data. Unlike conventional read-access memory (e.g., dynamic read-access memory (DRAM)), which stores data as electric charge or current flows (e.g., using capacitors), PCM uses the unique phase-change properties and behavior of chalcogenide glass, which is transformable between a crystalline state and an amorphous state by heating the material, or other material with similar properties and behavior. The crystalline and amorphous states of such a material have dramatically different electrical resistivity values. In many phase change materials, the amorphous state has a high resistance, which can also be referred to as a low conductivity, and can represent a logical binary value of 0. In contrast, the crystalline state has a low resistance, which can also be referred to as a high conductivity, and can represent a logical binary value of 1.

While the resistive value may represent a logical binary value of 1 or 0, the actual resistance of the logical binary values can be measured in ohms. For example, one can assign the minimum resistance of the device to a logical "0" and the maximum resistance of the device to a logical "1." As a particular example, in PCM devices made with $Ge_2Sb_2Te_5$, the resistive value of a logical "0" is engineered to be about 100 kilo Ohms while the resistive value of a logical "1" is about 10 mega Ohms. When a PCM device is used as an analog resistor, it may be set to any resistance value between the minimum resistance value and the maximum resistance value.

As noted above, phase-change material that is in the amorphous state has a high resistance compared to phase-change material that is in the crystalline state. More specifically, the range of resistance values of a phase-change material is bounded by a "set state" having a "set resistance" and a "reset state" having a "reset resistance." The set state is a low resistance structural state whose electrical properties are primarily controlled by the crystalline portion of the phase-change material, and the reset state is a high resistance structural state whose electrical properties are primarily controlled by the amorphous portion of the phase-change material. In other words, the set state can also be referred to as the crystalline state and/or a low resistance state. In contrast, the reset state can also be referred to as the amorphous state and/or a high resistance state.

In PCM devices, the relative amounts of phase-change material that are in the amorphous state and in the crystalline state within the PCM cell affect the electrical resistance of the PCM cell. This electrical resistance can be measured by passing a current through the PCM cell, and the measured electrical resistance can be converted into a value. Thus, the state of the material can be readily sensed to indicate data. Measuring the electrical resistance of the PCM cell can also be referred to as "reading" the cell or performing a "read operation."

To change the resistance state of the phase-change material, the ratio of crystalline material to amorphous material is changed. In particular, phase-change materials, like chalcogenide-based materials and similar materials, can be caused to change phase by application of electrical current at levels suitable for implementation in integrated circuits. Changing the resistance state of the PCM cell can also be referred to as "writing" or performing a "write operation" in which data is being stored in the form of a particular resistance value.

Changing the phase-change material from the amorphous state to the crystalline state is accomplished by applying a "set" current to the phase-change material. In contrast, changing the phase-change material from the crystalline state to the amorphous state is accomplished by applying a "reset" current to the phase-change material. The characteristics of the particular current pulses that are applied to the phase-change material determine whether the current acts as a set current or a reset current. For example, a set current can be a relatively longer, lower current pulse and a reset current can be a relatively shorter, higher current pulse. However, the principles of crystallization and amorphization underlying a write operation are complex and can also be impacted by the sharpness of the edges of applied current pulses and cumulative effects of multiple current pulses.

Overall, in order to amorphize the phase-change material inside the PCM device (RESET), a high voltage or current pulse with sharp edges is applied. The resulting power dissipation must be high enough such that, through Joule heating, the temperature within the PCM device reaches values above the melting temperature of the phase-change material. The induced melting erases any periodic atomic arrangement that was previously created. Once the phase-change material is molten, it must rapidly be cooled down (or quenched) in order to "freeze" the atomic structure into a disordered state. If the regime of fast crystallization is rapidly bypassed by fast quenching, the atomic mobility at temperatures below this regime becomes so small that the atoms cannot rearrange and find their most energetically favorable configuration during cooldown and are thus frozen into a non-equilibrium (or "glassy") amorphous state. This process is commonly referred to as glass transition and leads to the creation of the amorphous (high-resistance or RESET) state. In order to switch from the amorphous to the crystalline state (SET), a voltage or current pulse is applied to bring the temperature within the PCM device to a temperature inside the regime of fast crystallization. Moreover, the length of the pulse has to be long enough so that crystallization of previously created amorphous regions can occur. This process leads to the creation of a crystalline (low-resistance or SET) state.

A PCM device can be programmed, by performing a write operation, to any value of resistance between a minimum resistance (which can be referred to as "$R_{on}$") and a maximum resistance (which can be referred to as "$R_{off}$"). The minimum resistance ($R_{on}$) is typically obtained by performing a SET operation that fully crystallizes the phase change material between the bottom and top electrodes of the device. The maximum resistance ($R_{off}$) is typically achieved by performing a RESET operation that leads to the formation of amorphous phase change material that covers the bottom electrode and results in a highly resistive material between the bottom electrode and the remaining more conductive crystalline phase change material that is in contact with the top electrode. One noteworthy characteristic of a PCM device is its $R_{off}/R_{on}$ window, which refers to the ratio of its maximum resistance ($R_{off}$) divided by its minimum resistance ($R_{on}$). As a particular example, for a PCM device in which the phase change material is a doped $Ge_2Sb_2Te_5$, the typical $R_{on}$ is approximately 100 kilo Ohms and the typical $R_{off}$ is approximately 10 mega Ohms. Accordingly, the $R_{off}/R_{on}$ window is approximately 100.

The repeated application of SET and RESET currents (which can also be referred to as the performance of SET and RESET operations) during use of the PCM device can be referred to as "cycling." Cycling endurance presents a challenge in PCM devices. Failures can arise in phase-change memory cycling endurance due to atomic migration. For example, atomic migration can cause cells to get stuck in the set state (which may be caused by elemental segregation) or to get stuck in the reset state (which may be caused by void formation). Various driving forces responsible for atomic migration have been identified. One strategy for reducing atomic migration, and thereby improving cycling endurance, is to utilize a metallic liner to confine the phase-change memory cell. The metallic liner can be arranged between the bottom electrode and the phase-change material.

As noted above, changing the phase-change material from the crystalline state to the amorphous state generally includes applying a short high current density pulse to melt or break down the crystalline structure, after which the phase-change material is cooled quickly, quenching the phase-change process, such that at least a portion of the phase-change structure stabilizes in the amorphous state. It is desirable to minimize the magnitude of the reset current used to cause the transition of the phase-change material from the crystalline state to the amorphous state.

One way to reduce the magnitude of the reset current is by layering the phase-change material of the PCM cell with a non-phase-change material thereby forming a number of interfaces within the PCM cell. Introducing such interfaces within the PCM cell decreases the overall thermal conductance and therefore increases the thermal resistance of the PCM cell. As a result, the reset current is lowered. Additionally, using a metallic material as the non-phase change material can retain some of the cycling endurance benefits provided by the metallic liner, noted above. However, introducing such interfaces generates another issue, namely that the non-phase-change material layers can short-circuit the device such that there is effectively no $R_{off}/R_{on}$ window. While it is possible to tune a metallic layer so that it is not too conductive and can become an effective means to separate the read current path and the write current path, this remains an issue that must be addressed.

Another drawback of existing PCM technology is that PCM cells experience resistance drift as the resistance of the amorphous state slowly increases over time. Resistance-drift interferes with the ability to reliably distinguish a lower intermediate state from a higher intermediate state at a later time. Additionally, resistance-drift could jeopardize standard two-state operation if the threshold voltage increases beyond the design value.

Accordingly, it is desirable to develop a PCM device which balances the needs for a low reset current, a large $R_{off}/R_{on}$ window, a higher cycling endurance, and mitigated resistance drift.

SUMMARY

Embodiments of the present disclosure include a device including an electronic device. The electronic device includes a first electrode, a second electrode, and a memory component configured to store a resistive state. The memory component includes a layered region arranged in direct contact with the first electrode and a bulk region arranged in direct contact with the second electrode. The layered region includes a plurality of first layers made of a first material and a plurality of second layers made of a second material alternatingly arranged with one another. The first material is a phase-change material, and the second material is a non-phase-change material. The bulk region is a continuous mass made of a third material that is different than the first material and the second material, and the bulk region is in direct contact with at least two of the first layers and at least one of the second layers of the layered region.

Because the bulk region, which is in direct contact with the second electrode, is made of a third material that is different than the first material and the second material, such embodiments lack layers of either of the first material or the second material continuing through the bulk region. Therefore, the bulk region is less prone to short-circuiting while maintaining the advantages of low reset current, higher cycling endurance, and mitigated resistance drift that are imparted by the layers of first and second materials. In other words, one advantage of the disclosed embodiments is that the bulk region enables a large $R_{off}/R_{on}$ window without compromising the benefits provided by the layered region.

In accordance with some embodiments of the present disclosure, the third material can be a mixture of the first material and the second material. One advantage of such embodiments is that the bulk region can be formed by applying a mixing current to the layered region that is sufficient to cause portions of some first layers and portions of some second layers to irreversibly intermix with one another. Accordingly, such embodiments enable the advantageous structure while minimizing the need for additional fabrication processes.

Additional embodiments of the present disclosure include an electronic device. The electronic device includes a first electrode having a lowermost surface. The electronic device further includes a second electrode having an uppermost surface. The electronic device further includes a memory component configured to store a resistive state. The memory component includes a layered region in direct contact with the first electrode. The memory component further includes a bulk region arranged in direct contact with the uppermost surface of the second electrode. The layered region includes a plurality of first layers made of a first material and a plurality of second layers made of a second material alternatingly arranged with one another. The bulk region is a continuous mass made of a third material that is different than the first material and the second material. The bulk region is in direct contact with at least two of the first layers and at least one of the second layers of the layered region. The lowermost surface of the first electrode is substantially coplanar with the uppermost surface of the second electrode.

Because the bulk region, which is in direct contact with the second electrode, is made of a third material that is different than the first material and the second material, such embodiments lack layers of either of the first material or the second material continuing through the bulk region. Therefore, one advantage of the disclosed embodiments is that the bulk region enables a large $R_{off}/R_{on}$ window without compromising the benefits provided by the layered region. Additionally, such embodiments can be implemented in a flat PCM device arrangement in which the lowermost surface of the first electrode is substantially coplanar with the uppermost surface of the second electrode.

In accordance with some embodiments of the present disclosure, at least one of the first material or the second material can be a phase-change material. In other words, in such embodiments, either one or both of the first and second materials can be a phase-change material. One advantage of such embodiments is that a wider variety of materials can be used for the first and second layers without compromising the advantages imparted by the structure of the device.

Additional embodiments of the present disclosure include an electronic device. The electronic device includes a first electrode, a second electrode having an uppermost surface, and a memory component configured to store a resistive state. The memory component includes a layered region arranged in direct contact with the first electrode. The memory component further includes a bulk region arranged in direct contact with the uppermost surface of the second electrode. The layered region includes a plurality of first layers made of a first material and a plurality of second layers made of a second material alternatingly arranged with one another such that each first layer is in direct contact with a respective second layer at a respective planar interface surface. The bulk region is a continuous mass made of a third material that is different than the first material and the second material. The bulk region is in direct contact with at least two of the first layers and at least one of the second layers of the layered region. Each planar interface surface is substantially perpendicular to the uppermost surface.

Because the bulk region, which is in direct contact with the second electrode, is made of a third material that is different than the first material and the second material, such embodiments lack layers of either of the first material or the second material continuing through the bulk region. Therefore, one advantage of the disclosed embodiments is that the bulk region enables a large $R_{off}/R_{on}$ window without compromising the benefits provided by the layered region. Additionally, such embodiments can be implemented in a PCM device in which the first and second layers are formed next to one another vertically rather than being stacked on top of one another horizontally.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1A:
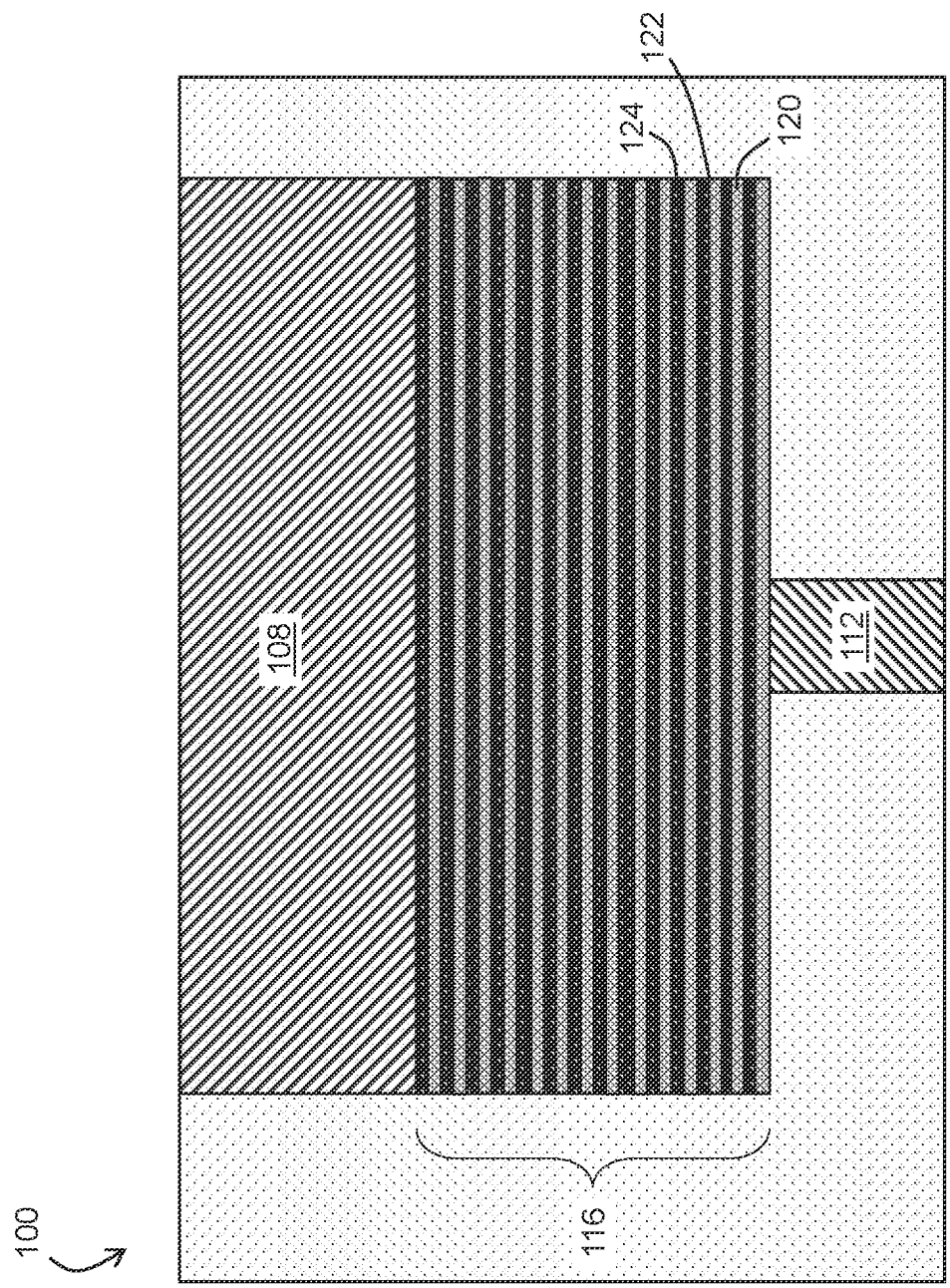
FIG. 1A depicts a schematic side cross-sectional drawing of a PCM device, in accordance with embodiments of the present disclosure.

Aspects of the present disclosure relate generally to the electrical, electronic, and computer fields. In particular, the present disclosure relates to phase-change memory (PCM) devices having a phase-change material in a layered structure. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Turning now to an overview of technologies that are more specifically relevant to aspects of the present disclosure, as noted above, it is desirable to develop a PCM device which balances the needs for a low reset current, a large $R_{off}/R_{on}$ window, a higher cycling endurance, and mitigated resistance drift. Embodiments of the present disclosure meet this need and address drawbacks of current solutions by electrically forming a bulk region of a mixture of materials that is capable of phase-change within a layered region of separated materials. As described in further detail below, such embodiments balance the needs for a low reset current, a large $R_{off}/R_{on}$ window, a higher cycling endurance, and mitigated resistance drift.

As shown in FIG. 1A, embodiments of the present disclosure include a PCM cell 100 including a top electrode 108, a bottom electrode 112, and a volume 116 of first and second materials 120, 124. The volume 116 is arranged so as to separate the top electrode 108 from the bottom electrode 112. As described in further detail below, the volume 116 is configured to store a resistive state, and therefore can also be referred to as a memory component.

More specifically, the volume 116 includes a plurality of first layers made of the first material 120 and a plurality of second layers made of the second material 124. The first material 120 is different than the second material 124. The first layers and the second layers are alternatingly arranged with one another. In other words, a second layer is arranged directly on top of a first layer, a further first layer is arranged directly on top of the second layer, a further second layer is arranged directly on top of the further first layer and so on. Accordingly, each second layer is arranged in direct contact with a respective first layer. Notably, in accordance with at least one embodiment of the present disclosure, the volume 116 can include an odd number of layers, in which case there may be one first or second layer that is not arranged in direct contact with a respective other layer.

FIG. 1A illustratively depicts a particular number of first layers and second layers. However, embodiments of the present disclosure enable a number of first and second layers that is greater than or less than what is illustratively represented by the figures. For example, embodiments of the present disclosure can include a few alternating layers or hundreds of layers of the first and second materials.

The first and second layers are arranged such that the first and second materials 120 and 124 are in direct contact with one another at a number of interfaces 122 within the volume 116. As used herein, the term "interface" refers to a surface where a first element is in direct contact with a second element. As shown in FIG. 1A, each interface 122 is substantially planar and spans the entire width of the volume 116. Each of the interfaces 122 is separated by a distance, which is equivalent to the thickness of the first and second layers. As described above, the interfaces 122 reduce the magnitude of the reset current by decreasing the overall thermal conductance and therefore increasing the thermal resistance of the PCM cell 100. The interfaces 122 also increase the electrical resistance of the layered material in the direction perpendicular to the alternating layers, thereby further reducing the reset current.

As noted above, alternating layers of a metallic non-phase change material with a phase-change material has been contemplated as a means to reduce the reset current and to improve cycling endurance of the PCM cell. However, in such PCM cells, the metallic non-phase-change material layer can short-circuit the device such that there is effectively no $R_{off}/R_{on}$ window.

As described in further detail below, embodiments of the present disclosure address this issue by electrically forming a mixed-material bulk region prior to programming the PCM cell. In accordance with some embodiments of the present disclosure, a phase-change material is alternatingly layered with another phase-change material such that the resulting mixed-material bulk region is a combination of two different phase-change materials. In accordance with some alternative embodiments of the present disclosure, a phase-change material is alternatingly layered with a non-phase-change material that is a high melting temperature material such that the resulting mixed-material bulk region is a combination of a phase-change material and a high melting temperature non-phase-change material. In either case, as described below, portions of the alternating layers are intermixed to form a bulk region which enables a large $R_{off}/R_{on}$ window for the PCM cell.

More specifically, in accordance with at least some embodiments of the present disclosure, both of the first and second materials 120, 124 are phase-change materials. In such embodiments, the first material 120 is a first phase-change material and the second material 124 is a second phase-change material that is different than the first phase-change material. As used herein, the term "different material" refers to a different overall chemical composition. To be clear, as used herein, the term "different material" does not refer to a different state or phase of the same chemical composition.

In accordance with some embodiments of the present disclosure, any of the phase-change materials used for either or both of the first and second materials 120, 124 can include dopants such as, for example, C, SiC, Si, SiN, $Ta_xO_y$, N, and O. In such embodiments, the presence of the dopants do not impact the functionalities of the phase-change materials described herein.

In accordance with at least some alternative embodiments of the present disclosure, one of the first and second materials 120, 124 is a phase-change material and the other of the first and second materials 120, 124 is not a phase-change material. In such embodiments, the non-phase-change material is a high melting temperature material. For such embodiments, suitable pairs of phase-change materials that could be used for the first and second materials 120, 124 could include, for example: 0.5-5 nm of $TiTe_2$ and 1-10 nm of $Sb_2Te_3$; 0.5-5 nm of $TiTe_2$ and 1-10 nm of $Ge_2Sb_2Te_5$; 0.5-5 nm of TaN and 1-10 nm of $Sb_2Te_3$; 0.5-5 nm of TaN and 1-10 nm of $Ge_2Sb_2Te_5$; 0.5-5 nm of C and 1-10 nm of $Sb_2Te_3$; and 0.5-5 nm of C and 1-10 nm of $Ge_2Sb_2Te_5$. Notably, either one of the materials of each pair can be the first material 120 and the other can be the second material 124. The thicknesses of the layers of each of the materials provided herein are for illustrative purposes. In alternative embodiments of the present disclosure, either or both of the layers can have different thicknesses so long as the overall functionalities described herein are not impacted.

Figure 1B:
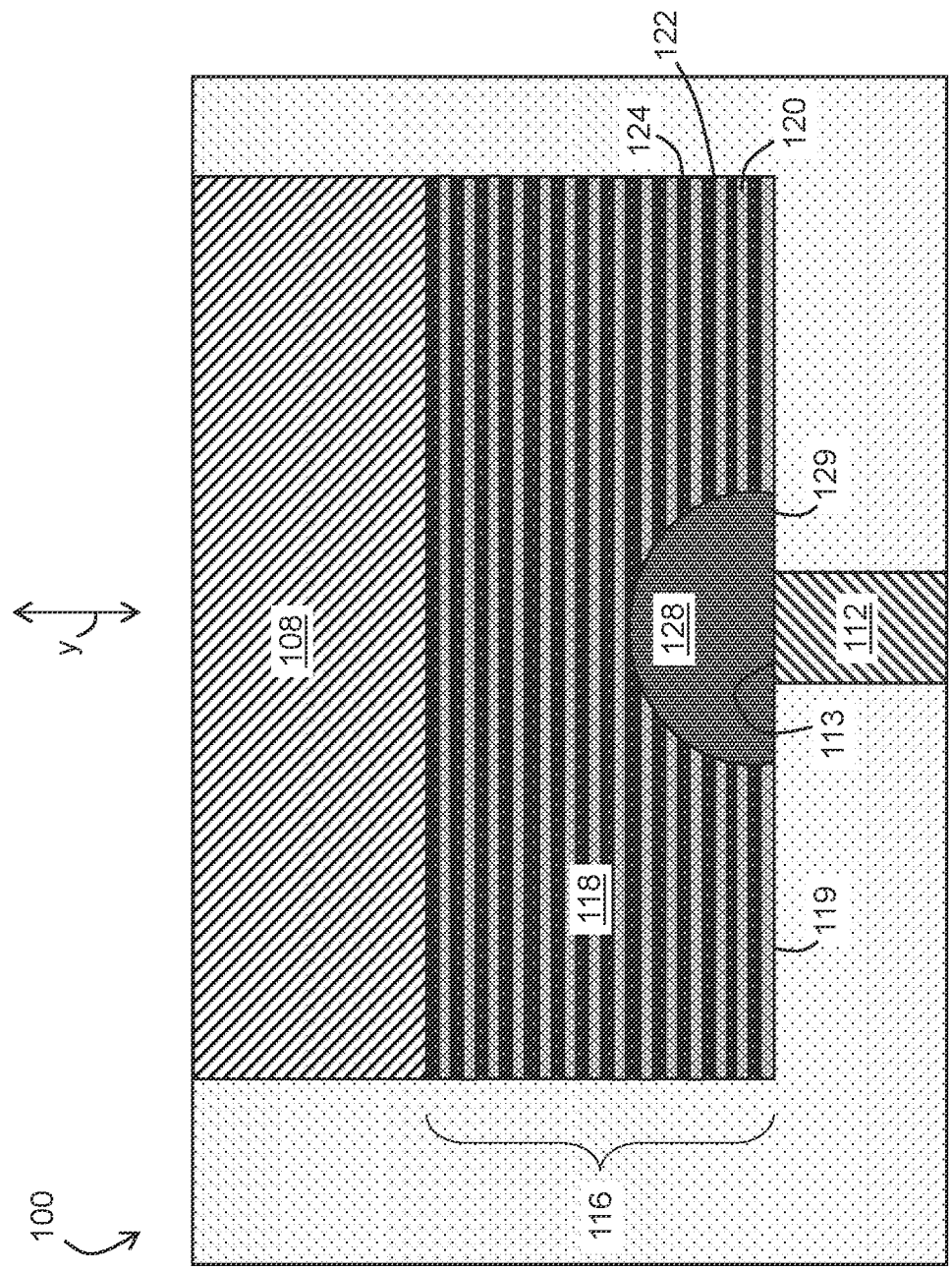
FIG. 1B depicts a schematic side cross-sectional drawing of the PCM device of FIG. 1A following the performance of a procedure, in accordance with embodiments of the present disclosure.

In either case, embodiments of the present disclosure include intermixing portions of layers of the first material 120 with portions of layers of the second material 124. FIG. 1B illustrates the PCM cell 100 including a bulk region 128 formed by intermixing portions of layers of the first material 120 with portions of layers of the second material 124. In particular, such intermixing can be accomplished by applying an electric current to the volume 116 through the bottom electrode 112. In other words, the bulk region 128 can be generated by what is referred to herein as an electrical forming procedure or a forming procedure. The forming current that is applied to the volume 116 must be sufficient to intermix portions of layers of the first material 120 and portions of layers of the second material 124.

Notably, as used herein, the term "intermix" refers to the irreversible combination of different materials to form a new material that is not entirely separable back into the different materials. Accordingly, the bulk region 128, which is formed by intermixing the first and second materials 120, 124, is made of a third material that is a mixture of the first material 120 and the second material 124 and is different than both the first material 120 and the second material 124. As a result, no layers of the first material 120 and no layers of the second material 124 are retained within or extend into the bulk region 128. In other words, the bulk region 128 does not include any layers of the first material 120 and does not include any layers of the second material 124.

Instead, as shown in FIG. 1B, the bulk region 128 is a continuous mass in which the third material is generally homogenous or graded or is a non-ordered combination of the first and second materials. As used herein, the term "continuous" refers to a whole that is unbroken and uninterrupted by another structure. Notably, in some embodiments, areas of the first or second material 120, 124 may be present within the bulk region 128. However, in such embodiments, such areas are stochastically arranged and disorganized within the bulk region 128. As noted above, the bulk region 128, once electrically formed, is not layered.

As shown in FIG. 1B, as a result of the forming procedure, the volume 116 includes a layered region 118 and a bulk region 128 formed such that the layered region 118 is in direct contact with the top electrode 108 and is separated from the bottom electrode 112 by the bulk region 128 and such that the bulk region 128 is in direct contact with the bottom electrode 112 and is separated from the top electrode 108 by the layered region 118. This separation of the layers of first and second materials 120, 124 from the bottom electrode 112 by the third material of the bulk region 128 advantageously enables the large $R_{off}/R_{on}$ window of the embodiments of the present disclosure.

As illustrated by FIG. 1B, the separation of the layers of the first and second materials 120, 124 from the bottom electrode 112 by the third material of the bulk region 128 is made possible despite the coplanar arrangement of the lowermost surfaces of the bulk region 128 and the layered region 118. More specifically, as shown in FIG. 1B, the bulk region 128 includes a lowermost surface 129 that is arranged in direct contact with an uppermost surface 113 of the bottom electrode 112. The layered region 118 also includes a lowermost surface 119 that is substantially coplanar with the lowermost surface 129 of the bulk region 128. However, due to the formation of the bulk region 128 by the electrical forming procedure, the layered region 118 does not directly contact the bottom electrode 112.

As used herein, the term "coplanar" refers to two surfaces that lie in a common plane. In other words, two surfaces are coplanar if there exists a geometric plane that contains all of the points of both of the surfaces. As used herein, the term "substantially" refers to an extent to which minor deviations are included such that the deviations do not impact the desired result. Accordingly, two surfaces may be referred to as substantially coplanar despite deviations from coplanarity on an atomic scale, so long as those deviations do not impact the desired result of the coplanarity.

The bulk region 128 extends from the bottom electrode 112 at least far enough to directly contact at least one layer of the first material 120 and at least one layer of the second material 124 to enable the bulk region 128 to be formed from a combination of portions of first and second layers. In other words, the bulk region 128 is in direct contact with at least one of the layers of the first material 120 and at least one of the layers of the second material 124. In accordance with at least one embodiment of the present disclosure, the bulk region 128 is in direct contact with at least two layers of the first material 120 and at least one layer of the second material 124 to ensure that the intermixed third material of the bulk region 128 includes sufficient amounts of each of the first material 120 and the second material 124.

As shown in FIG. 1B, the bulk region 128 extends in a direction (indicated by the reference axis labeled "y") that is substantially perpendicular relative to the surfaces of the interfaces 122 of the layered region 118. The distance that the bulk region 128 extends in this direction y is greater than the distance that separates each of the interfaces 122. Accordingly, as noted above, the bulk region 128 is in direct contact with at least one layer of the first material 120 and at least one layer of the second material 124.

The third material that makes up the bulk region 128 includes an amount of phase-change material provided by one or both of the first and second materials 120, 124 that is sufficient to enable the third material to act as a phase-change material. Accordingly, once the forming procedure has been performed, resulting in the bulk region 128, the PCM cell 100 can be programmed by applying write currents through the bottom electrode 112. As noted above, the characteristics of the applied current pulses determine how much of the phase-change material is in the low-resistance crystalline state and how much is in the high-resistance amorphous state.

Notably, the forming procedure results in the arrangement of the bulk region 128 emanating from the bottom electrode 112. This is due to the bottom electrode 112 acting as the source of the current for the forming procedure as well as the asymmetry between the dimensions of the top electrode 108 and the bottom electrode 112. As the forming current is applied, the current density will be higher nearer to the bottom electrode 112 and will dissipate with heat transfer within the volume 116. Once the bulk region 128 has been formed, third material that is in the amorphous state can act as a block for current from the bottom electrode 112 such that thermal energy is absorbed by the bulk region 128 until the melting temperature of the third material is reached. Accordingly, the higher the thermal resistance of the third material, the lower the power needed to melt the phase-change material, and therefore the more efficient the PCM cell 100.

Accordingly, the forming procedure enables advantages of the embodiments disclosed herein, particularly for those embodiments in which a non-phase-change material is used as one of the first and second materials. More specifically, if a write current were to be applied to the PCM cell 100 shown in FIG. 1A that included a non-phase-change material without the formation of the bulk region 128, the low resistivity of the non-phase-change material would not enable the write operation to be performed. Therefore, particularly for embodiments of the present disclosure in which one of the layers of the volume 116 is made of a non-phase-change material, the performance of the electrical forming procedure enables an otherwise unusable device to be made usable.

Figure 1C:
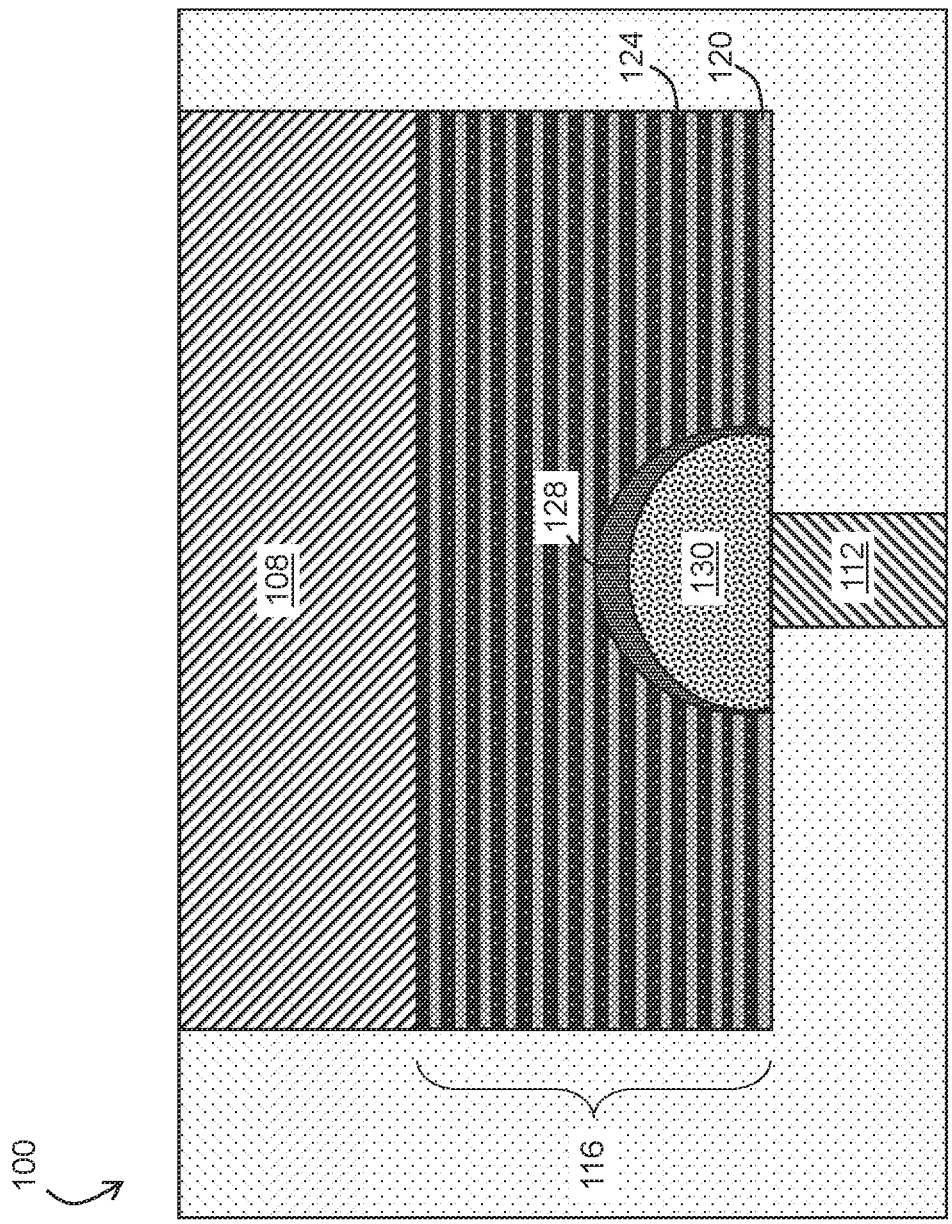
FIG. 1C depicts another schematic side cross-sectional drawing of the PCM device of FIG. 1A following the performance of a procedure, in accordance with embodiments of the present disclosure.
Figure 2:
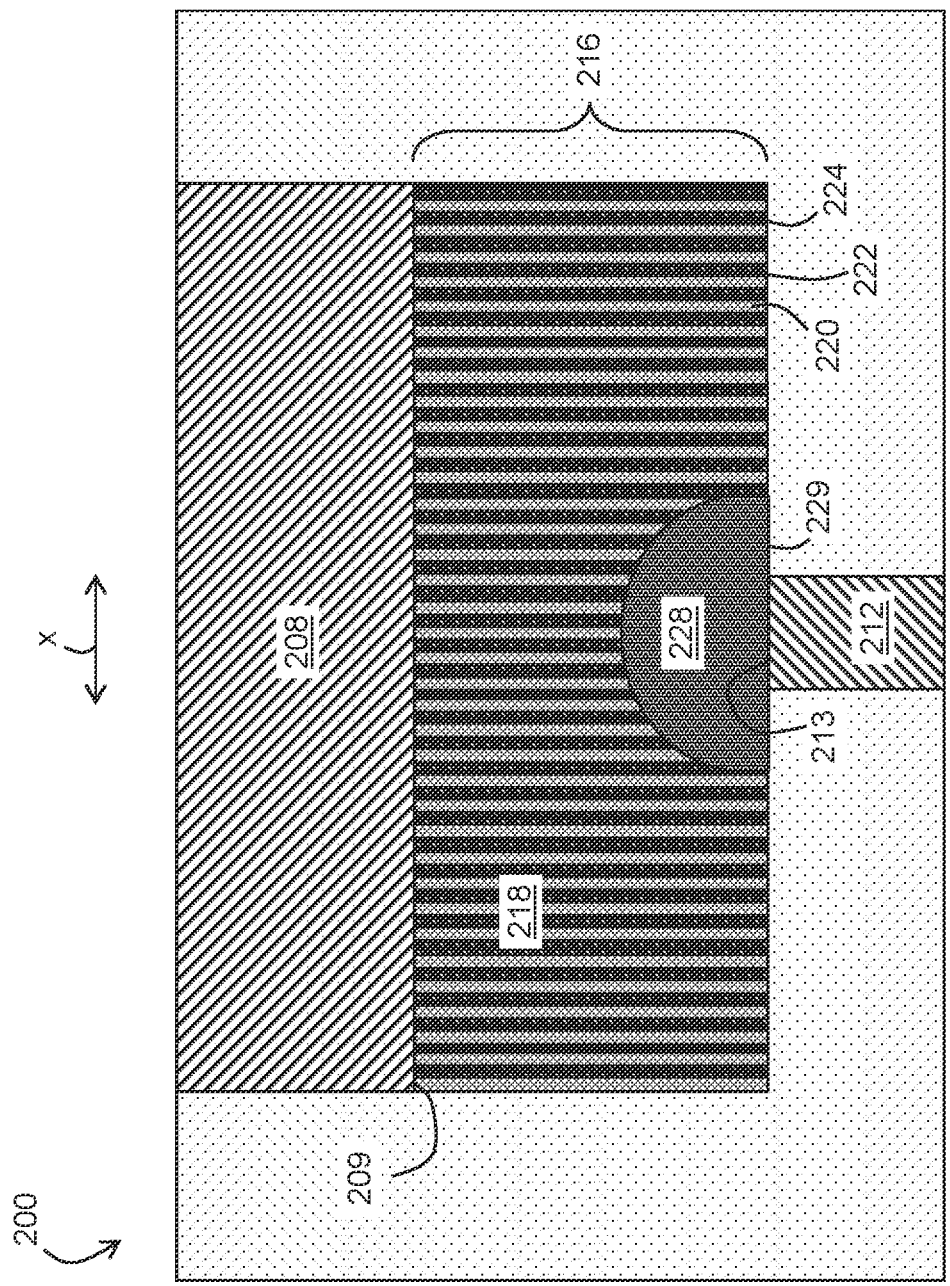
FIG. 2 depicts a schematic side cross-sectional drawing of a PCM device, in accordance with embodiments of the present disclosure.

Turning now to FIG. 1C, embodiments of the present disclosure further enable the formation of a bulk region 128 that is larger than a volume 130 that is used for programming the PCM cell 100. For example, using a larger current pulse for the forming procedure than is used for programming, may generate a bulk region 128 that is larger than the volume 130 that is used for programming. In other words, in some embodiments of the present disclosure, less than the entirety of the bulk region 128 is utilized for memory storage. Additionally, or alternatively, the volume 130 of the bulk region 128 that is used for programming the PCM cell 100 may vary as is functionally appropriate such that the volume 130 may sometimes be equal to the entirety of the bulk region 128 and may sometimes be less than the entirety of the bulk region 128. FIG. 2 illustrates a PCM cell 200 in accordance with at least one embodiment of the present disclosure. Notably, the PCM cell 200 is substantially similar to the PCM cell 100 described above with reference to FIGS. 1A-1C. Therefore, similar reference numerals (differing only in their first digit) are used to refer to substantially similar structures that perform substantially similar functions. The PCM cell 200 differs principally from the PCM cell 100 in that the arrangement of the layers of first and second materials 220, 224 within the volume 216 is perpendicular relative to the arrangement of the layers of the first and second materials 120, 124 within the volume 116.

More specifically, in embodiments of the PCM cell 100 shown in FIGS. 1A-1C, each planar interface 122 is substantially parallel to the uppermost surface 113 (shown in FIG. 1B) of the bottom electrode 112. In contrast, in embodiments of the PCM cell 200 shown in FIG. 2, each planar interface surface 222 is substantially perpendicular to the uppermost surface 213 of the bottom electrode 212. Accordingly, each planar interface 222 is also substantially perpendicular to the lowermost surface 229 of the bulk region 228 and is also substantially perpendicular to a lowermost surface 209 of the top electrode 208, which is substantially parallel to the uppermost surface 213 and the lowermost surface 229.

Notably, like the bulk region 128 in the PCM cell 100, the bulk region 228 in the PCM cell 200 extends in a direction that is substantially perpendicular relative to the surfaces of the interfaces 222 of the layered region 218. However, in the PCM cell 200, this direction is indicated by the reference axis labeled "x" instead of "y" because the surfaces of the interfaces 222 are perpendicular relative to the surfaces of the interfaces 122. As with the bulk region 128, the distance that the bulk region 228 extends in this direction x is greater than the distance that separates each of the interfaces 222 such that the bulk region 228 is in direct contact with at least one layer of the first material 220 and at least one layer of the second material 224. Accordingly, the PCM cell 200 retains the benefits discussed above with respect to the PCM cell 100.

Figure 3:
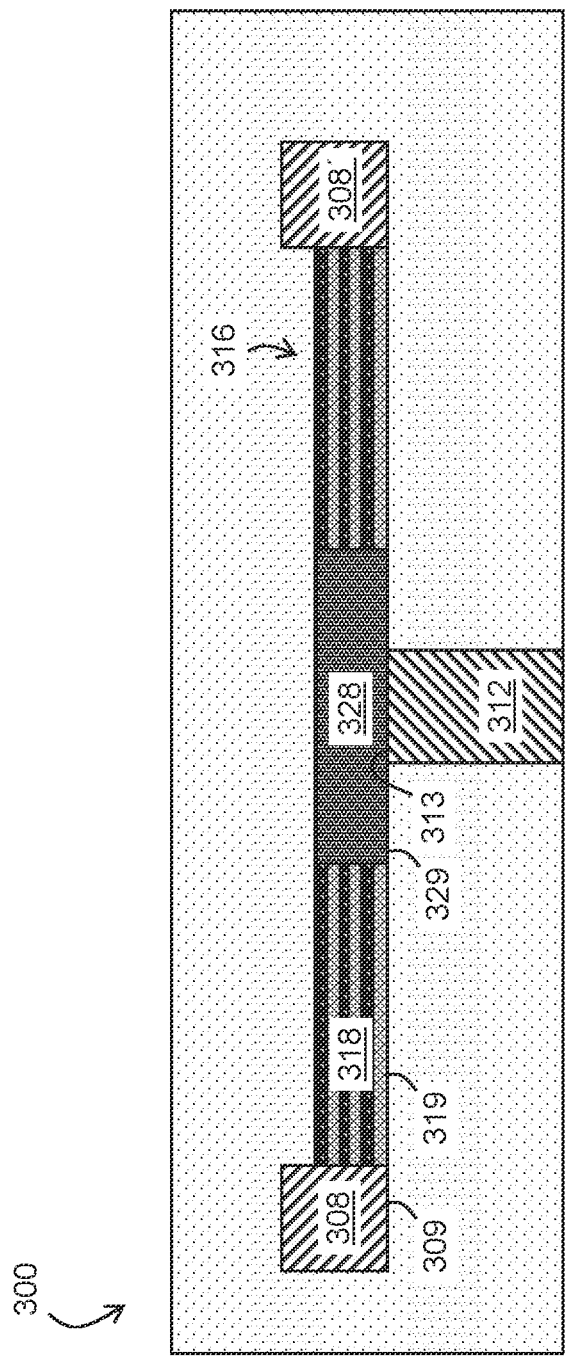
FIG. 3 depicts a schematic side cross-sectional drawing of a PCM device, in accordance with embodiments of the present disclosure.

FIG. 3 illustrates a PCM cell 300 in accordance with at least one embodiment of the present disclosure. Notably, the PCM cell 300 is substantially similar to the PCM cell 100 described above with reference to FIGS. 1A-1C. Therefore, similar reference numerals (differing only in their first digit) are used to refer to substantially similar structures that perform substantially similar functions. The PCM cell 300 differs principally from the PCM cell 100 in that the arrangement of the top electrode 308 is in line with the volume 316 rather than being arranged above the volume 316. In accordance with at least one embodiment of the present disclosure, the PCM cell 300 can include a second top electrode 308' arranged on the opposite side of the volume 316 as top electrode 308. In such embodiments, the two top electrodes 308, 308' are arranged on opposite sides of the volume 316. Notably, in accordance with various embodiments of the present disclosure, the PCM cell 300 may include just one of the two top electrodes 308 or 308' or both top electrodes 308 and 308'. Accordingly, the following description of top electrode 308 can also be applied to top electrode 308'.

More specifically, in embodiments of the PCM cell 100 shown in FIGS. 1A-1C, a lowermost surface of the top electrode 108 is arranged substantially parallel to the uppermost surface 113 of the bottom electrode 112, but is not substantially coplanar with the uppermost surface 113 of the bottom electrode 112. Instead, the lowermost surface of the top electrode 108 is separated from the uppermost surface 113 of the bottom electrode 112 by a distance that is greater than zero. In particular, the thickness of the volume 116 separates the lowermost surface of the top electrode 108 from the uppermost surface 113 of the bottom electrode 112.

In contrast, in embodiments of the PCM cell 300 shown in FIG. 3, a lowermost surface 309 of the top electrode 308 is substantially parallel to the uppermost surface 313 of the bottom electrode 312 and is also substantially coplanar with the uppermost surface 313. Accordingly, the lowermost surface 309 of the top electrode 308 is also substantially coplanar with the lowermost surface 329 of the bulk region 328 and the lowermost surface 319 of the layered region 318, which are substantially coplanar with the uppermost surface 313 of the bottom electrode 312.

Notably, as in the PCM cell 100, the bulk region 328 in the PCM cell 300 is separated from the top electrode 308 by the layered region 318, and the layered region 318 is separated from the bottom electrode 312 by the bulk region 328. Accordingly, the PCM cell 300 retains the benefits discussed above with respect to the PCM cell 100.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure.

Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. An electronic device comprising:
a first electrode;
a second electrode; and
a memory component configured to store a resistive state, the memory component including a layered region arranged in direct contact with the first electrode and a bulk region arranged in direct contact with the second electrode, wherein:
the layered region includes a plurality of first layers made of a first material and a plurality of second layers made of a second material alternatingly arranged with one another,
the first material is a phase-change material and the second material is a non-phase-change material,
the bulk region is a continuous mass made of a third material that is different than the first material and the second material, and
the bulk region is in direct contact with at least two of the first layers and at least one of the second layers of the layered region.

2. The electronic device of claim 1, wherein:
the third material is a mixture of the first material and the second material.

3. The electronic device of claim 1, wherein:
the bulk region is separated from the first electrode by the layered region.

4. The electronic device of claim 1, wherein:
the layered region is separated from the second electrode by the bulk region.

5. The electronic device of claim 1, wherein:
the bulk region includes a first lowermost surface arranged in direct contact with an uppermost surface of the second electrode,
the layered region includes a second lowermost surface arranged substantially coplanarly with the first lowermost surface.

6. The electronic device of claim 5, wherein:
the first electrode includes a third lowermost surface arranged substantially coplanarly with the second lowermost surface.

7. The electronic device of claim 5, wherein:
the first electrode includes a third lowermost surface separated from the second lowermost surface by a distance that is greater than zero.

8. The electronic device of claim 7, wherein:
the third lowermost surface is substantially parallel to the uppermost surface.

9. The electronic device of claim 5, wherein:
each first layer is in direct contact with a respective second layer at a respective planar interface surface such that each planar interface surface is separated by a first distance,
the bulk region extends a second distance in a direction substantially perpendicular to the planar interface surfaces, and
the second distance is greater than the first distance.

10. The electronic device of claim 9, wherein:
each planar interface surface is substantially parallel to the uppermost surface.

11. The electronic device of claim 9, wherein:
each planar interface surface is substantially perpendicular to the uppermost surface.

12. An electronic device comprising:
a first electrode having a lowermost surface;
a second electrode having an uppermost surface; and
a memory component configured to store a resistive state, the memory component including:
a layered region in direct contact with the first electrode, and
a bulk region arranged in direct contact with the uppermost surface of the second electrode, wherein:
the layered region includes a plurality of first layers made of a first material and a plurality of second layers made of a second material alternatingly arranged with one another,
the bulk region is a continuous mass made of a third material that is different than the first material and the second material,
the bulk region is in direct contact with at least two of the first layers and at least one of the second layers of the layered region, and
the lowermost surface of the first electrode is substantially coplanar with the uppermost surface of the second electrode.

13. The electronic device of claim 12, wherein:
at least one of the first material or the second material is a phase-change material.

14. The electronic device of claim 12, wherein:
the third material is a mixture of the first material and the second material.

15. The electronic device of claim 12, wherein:
the layered region is separated from the second electrode by the bulk region.

16. The electronic device of claim 12, wherein:
the layered region has a further lowermost surface arranged substantially coplanarly with the lowermost surface of the first electrode.

17. An electronic device comprising:
a first electrode;
a second electrode having an uppermost surface; and
a memory component configured to store a resistive state, the memory component including a layered region arranged in direct contact with the first electrode and a bulk region arranged in direct contact with the uppermost surface of the second electrode, wherein:
the layered region includes a plurality of first layers made of a first material and a plurality of second layers made of a second material alternatingly arranged with one another such that each first layer is in direct contact with a respective second layer at a respective planar interface surface,
the bulk region is a continuous mass made of a third material that is different than the first material and the second material,
the bulk region is in direct contact with at least two of the first layers and at least one of the second layers of the layered region, and
each planar interface surface is substantially perpendicular to the uppermost surface.

18. The electronic device of claim 17, wherein:
at least one of the first material or the second material is a phase-change material.

19. The electronic device of claim 17, wherein:
the third material is a mixture of the first material and the second material.

20. The electronic device of claim 17, wherein:
each planar interface surface is separated by a first distance,
the bulk region extends a second distance in a direction substantially perpendicular to the planar interface surfaces, and
the second distance is greater than the first distance.

* * * * *